United States Patent
Nakamura et al.

(10) Patent No.: US 11,863,162 B2
(45) Date of Patent: Jan. 2, 2024

(54) FILTER, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventors: Kentaro Nakamura, Nagaokakyo (JP); Noriyoshi Ota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 360 days.

(21) Appl. No.: 17/463,737

(22) Filed: Sep. 1, 2021

(65) Prior Publication Data
US 2021/0399719 A1      Dec. 23, 2021

Related U.S. Application Data

(63) Continuation of application No. PCT/JP2020/009636, filed on Mar. 6, 2020.

(30) Foreign Application Priority Data

Mar. 6, 2019 (JP) ................................ 2019-040593

(51) Int. Cl.
    *H03H 9/145*    (2006.01)
    *H03H 9/64*     (2006.01)
    (Continued)

(52) U.S. Cl.
    CPC ............ *H03H 9/6483* (2013.01); *H03F 3/19* (2013.01); *H03H 9/145* (2013.01); *H03H 9/25* (2013.01);
    (Continued)

(58) Field of Classification Search
    CPC .......... H03H 9/6483; H03H 9/25; H03H 9/72; H03H 9/145; H03F 2200/451; H03F 3/19
    See application file for complete search history.

(56) References Cited

U.S. PATENT DOCUMENTS 8,698,578 B2 * 4/2014 Nakanishi .......... H03H 9/14526
                                                  333/133
10,153,748 B2 * 12/2018 Tanaka ............... H03H 9/14594
(Continued)

FOREIGN PATENT DOCUMENTS

EP     3007358 A1 *  4/2016  ......... H03H 9/02992
JP     2011-182220 A   9/2011
(Continued)

OTHER PUBLICATIONS

Official Communication issued in International Patent Application No. PCT/JP2020/009636, dated May 26, 2020.

*Primary Examiner* — Hai V Nguyen
(74) *Attorney, Agent, or Firm* — Keating & Bennett, LLP

(57) ABSTRACT

A filter includes series resonators on a signal path, each of the series resonator including an IDT electrode that includes first electrode fingers each including a variant portion, second electrode fingers each including no variant portion, or both the first electrode fingers and the second electrode fingers, in the IDT electrode of one or more series resonators of the series resonators, a direction connecting other-side end portions of electrode fingers crosses an acoustic wave propagation direction, the IDT electrode includes the first electrode fingers, a first portion of an IDT electrode of another series resonator centrally located in the acoustic wave propagation direction, includes only the first electrode fingers, and a second portion and a third portion on two sides of the first portion each include only the second electrode fingers.

20 Claims, 13 Drawing Sheets

(51) Int. Cl.
*H03F 3/19* (2006.01)
*H03H 9/25* (2006.01)
*H03H 9/72* (2006.01)

(52) U.S. Cl.
CPC ......... *H03H 9/72* (2013.01); *H03F 2200/451* (2013.01)

(56) References Cited

U.S. PATENT DOCUMENTS

| | | | |
|---|---|---|---|
| 10,333,487 B2* | 6/2019 | Kishino | H03H 9/14582 |
| 10,469,055 B2* | 11/2019 | Iwamoto | H03H 9/02031 |
| 10,979,027 B2* | 4/2021 | Nosaka | H03F 3/19 |
| 2006/0208834 A1* | 9/2006 | Takamine | H03H 9/14588 |
| | | | 333/195 |
| 2011/0199163 A1* | 8/2011 | Yamanaka | H03H 9/02551 |
| | | | 331/158 |
| 2011/0215883 A1 | 9/2011 | Fujiwara et al. | |
| 2012/0044027 A1* | 2/2012 | Nakanishi | H03H 9/14526 |
| | | | 333/133 |
| 2016/0261038 A1* | 9/2016 | Tanaka | H03H 9/64 |
| 2016/0294361 A1 | 10/2016 | Yamane et al. | |
| 2017/0047905 A1* | 2/2017 | Araki | H03H 9/02535 |
| 2017/0222624 A1* | 8/2017 | Kishino | H03H 9/02685 |
| 2018/0097508 A1* | 4/2018 | Iwamoto | H03H 9/6496 |
| 2018/0102755 A1 | 4/2018 | Takamine | |
| 2018/0316333 A1* | 11/2018 | Nakamura | H03H 9/54 |
| 2019/0123721 A1 | 4/2019 | Takamine | |
| 2021/0006227 A1* | 1/2021 | Ito | H03H 9/64 |
| 2021/0067136 A1* | 3/2021 | Fujiwara | H03H 9/6489 |
| 2022/0014171 A1* | 1/2022 | Ozasa | H03H 9/02015 |
| 2022/0416762 A1* | 12/2022 | Noguchi | H03H 9/25 |
| 2023/0253952 A1* | 8/2023 | Iwaki | H03H 9/725 |
| | | | 333/186 |

FOREIGN PATENT DOCUMENTS

| | | |
|---|---|---|
| WO | 2015/098756 A1 | 7/2015 |
| WO | 2016/208236 A1 | 12/2016 |
| WO | 2018/003273 A1 | 1/2018 |

* cited by examiner

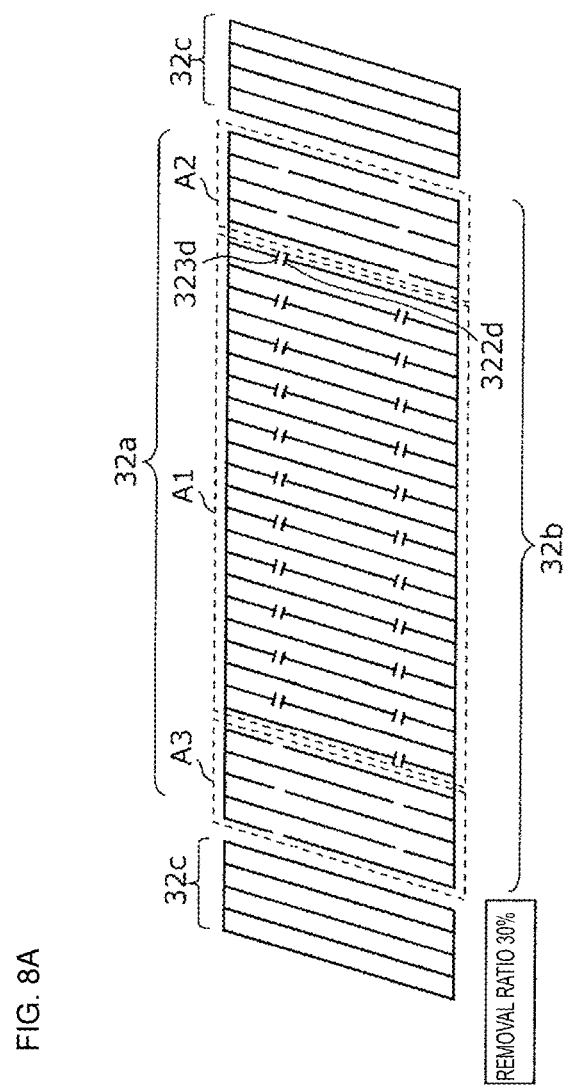

FILTER, MULTIPLEXER, RADIO FREQUENCY FRONT-END CIRCUIT, AND COMMUNICATION DEVICE

CROSS REFERENCE TO RELATED APPLICATIONS

This application claims the benefit of priority to Japanese Patent Application No. 2019-040593 filed on Mar. 6, 2019 and is a Continuation application of PCT Application No. PCT/JP2020/009636 filed on Mar. 6, 2020. The entire contents of each application are hereby incorporated herein by reference.

BACKGROUND OF THE INVENTION

1. Field of the Invention

The present invention relates to filters, multiplexers, radio frequency front-end circuits, and communication devices.

2. Description of the Related Art

In general, it is known that a transverse mode is suppressed by using a slanted IDT electrode portion, which is an IDT electrode portion whose electrode finger intersecting portion is formed at an angle with respect to the acoustic wave propagation direction.

This slanted IDT electrode portion is particularly effective when applied to an acoustic wave device in which a high acoustic velocity film, a low acoustic velocity film, a piezoelectric film, and an IDT electrode are stacked on a support substrate in this order. This is because, although the acoustic wave device including the foregoing multilayer substrate enables an increased Q factor, transverse mode ripples appear due to frequency characteristics thereof.

On the other hand, in such a slanted IDT electrode portion, standing waves are formed in gap portions located between opposing busbars or between opposing offset electrode fingers, and this causes ripples near a resonant frequency. In view of the above, a technique has been proposed to reduce the ripples near a resonant frequency by further providing a variant portion, which projects toward the acoustic wave propagation direction, on a top portion of an electrode finger (for example, see International Publication No. 2015/098756). An electrode finger having the variant portion on the top portion thereof is referred to as a variant finger in the present specification.

In a resonator in which the variant fingers are used as electrode fingers of the slanted IDT electrode portion, it becomes possible to suppress the ripples near a resonant frequency. However, the variant finger causes ripples near an anti-resonant frequency.

In a multiplexer including a plurality of filters, the ripples formed near an anti-resonant frequency of a resonator included in one filter may sometimes be located in a pass band of another filter. In that case, the ripples formed near an anti-resonant frequency of a resonator included in one of the plurality of filters may causes a degradation in the characteristics of a pass band of another filter.

SUMMARY OF THE INVENTION

Preferred embodiments of the present invention provide filters that each reduce or prevent both ripples near a resonant frequency and ripples near an anti-resonant frequency, and further provide multiplexers, radio frequency front-end circuits, and communication devices, each of which include such a filter.

A filter according to a preferred embodiment of the present invention includes a pair of input/output terminals; and one or more series resonators on a signal path connecting the pair of input/output terminals, wherein each of the one or more series resonators includes an IDT electrode including a pair of comb-shaped electrodes on a substrate including a piezoelectric layer, each of the pair of comb-shaped electrodes included in each of the one or more series resonators includes a plurality of electrode fingers extending in a direction orthogonal or substantially orthogonal to an acoustic wave propagation direction, and a busbar electrode connecting one-side end portions of respective ones of the plurality of electrode fingers, the IDT electrode of each of the one or more series resonators includes a first electrode finger, a second electrode finger, or both of the first electrode finger and the second electrode finger, the first electrode finger having a wider electrode finger width at an another-side end portion thereof than an electrode finger width at a center portion thereof, the second electrode finger having a narrower or equal electrode finger width at an another-side end portion thereof than an electrode finger width at a center portion thereof, the one or more series resonators include one or more first series resonators, in the IDT electrode of each of the one or more first series resonators, a direction connecting the another-side end portions of respective ones of the plurality of electrode fingers crosses the acoustic wave propagation direction, and a first portion of the IDT electrode of each of the one or more first series resonators includes only the first electrode fingers, and a second portion and a third portion include only the second electrode fingers, the first portion being centrally located in the acoustic wave propagation direction, the second portion and the third portion being located on two sides of the first portion in the acoustic wave propagation direction.

In filters according to preferred embodiments of the present invention, the first electrode fingers (variant fingers) and the second electrode fingers (fingers including no variant portion) are provided in a mixed manner in the IDT electrode of the first series resonator. This reduces or prevents both the ripples near an anti-resonant frequency that are likely to increase in the case where the first electrode finger is used for all of the electrode fingers and the ripples near a resonant frequency that are likely to increase in the case where the second electrode finger is used for all of the electrode fingers. As a result, it is possible to provide filters that each reduce or prevent both ripples near a resonant frequency and ripples near an anti-resonant frequency.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8A is a plan view illustrating an exemplary arrangement of a first electrode finger and a second electrode finger in an IDT electrode of a filter according to a working example of a preferred embodiment of the present invention.

DETAILED DESCRIPTION OF THE PREFERRED EMBODIMENTS

Figure 1:
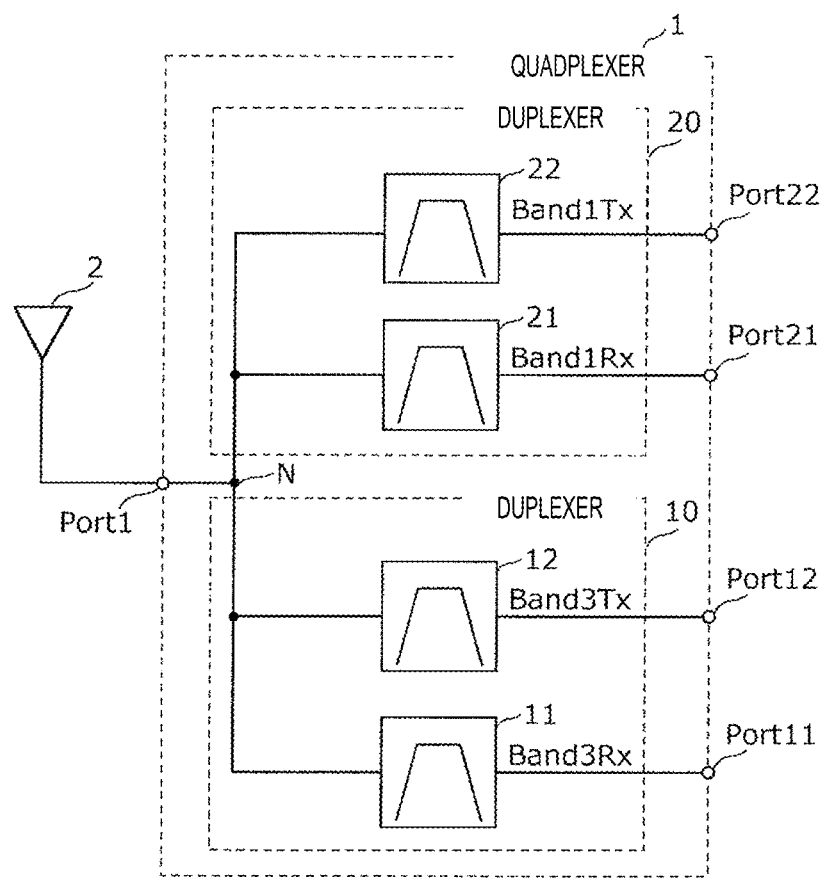
FIG. 1 is a configuration diagram of a quadplexer according to a first preferred embodiment of the present invention.

Hereinafter, preferred embodiments of the present invention will be described in detail using working examples and the drawings. Note that the preferred embodiments, which will be described below, each illustrate a comprehensive or specific example. Numeric values, shapes, materials, elements, arrangements and connection configurations of the elements, and the like illustrated in the following preferred embodiments are mere examples, and not intended to limit the present invention. Of elements in the following preferred embodiments, the elements that are not described in an independent claim will be described as optional elements. Further, sizes or ratios of the sizes of elements illustrated in the drawings are not necessarily exact. Further, in the drawings, the same reference characters denote the same or substantially the same elements, and in some cases an overlapping description is omitted or simplified. Further, in the following preferred embodiments, the term "connect" means not only the case of direct connection, but also the case where an electrical connection is established with another element or the like interposed therebetween.

First Preferred Embodiment

In the description of the present preferred embodiment, a quadplexer is used as an example of a multiplexer.

1. Basic Configuration of Multiplexer

FIG. 1 is a configuration diagram of a quadplexer 1 according to the present preferred embodiment. Note that FIG. 1 also illustrates an antenna 2 that is connected to a common terminal Port1 of the quadplexer 1.

The quadplexer 1 is a multiplexer (demultiplexer) that includes a plurality of filters each having different pass band (here, for example, four filters 11, 12, 21, and 22) and in which the plurality of filters are bundled together at the common terminal Port1.

Specifically, as illustrated in FIG. 1, the quadplexer 1 includes the common terminal Port1, four individual terminals Port11, Port12, Port21, and Port22, and the four filters 11, 12, 21, and 22.

The common terminal Port1 is provided in common for the four filters 11, 12, 21, and 22 and is connected to these filters 11, 12, 21, and 22 in the inside of the quadplexer 1.

Further, the common terminal Port1 is connected to the antenna 2 at the outside of the quadplexer 1. That is, the common terminal Port1 is also an antenna terminal of the quadplexer 1.

The individual terminals Port11, Port12, Port21, and Port22 are respectively provided for the four filters 11, 12, 21, and 22 in this order, and are connected to the corresponding filters in the inside of the quadplexer 1. Further, on the outside of the quadplexer 1, the individual terminals Port11, Port12, Port21, and Port22 are connected to a RF signal processing circuit (for example, an RFIC: Radio Frequency Integrated circuit, not illustrated) via amplifier circuits or the like (not illustrated).

The filter 11 is provided on a path connecting the common terminal Port1 and the individual terminal Port11, and in the present preferred embodiment, is a reception filter whose pass band is, for example, a downlink frequency band (reception band) in Band 3 of LTE (Long Term Evolution). In the present preferred embodiment, the filter 11 corresponds to a second filter on a second path connecting the common terminal Port1 and a second terminal (here, the individual terminal Port11).

The filter 12 is provided on a path connecting the common terminal Port1 and the individual terminal Port12, and in the present preferred embodiment, is a transmission filter whose pass band is, for example, an uplink frequency band (transmission band) in Band 3 of LTE. In the present preferred embodiment, the filter 12 corresponds to a first filter on a first path connecting the common terminal Port1 and a first terminal (here, the individual terminal Port12).

The filter 21 is provided on a path connecting the common terminal Port1 and the individual terminal Port21, and in the present preferred embodiment, is, for example, a reception filter whose pass band is a downlink frequency band (reception band) in Band 1 of LTE.

The filter 22 is provided on a path connecting the common terminal Port1 and the individual terminal Port22, and in the present preferred embodiment, is, for example, a transmission filter whose pass band is an uplink frequency band (transmission band) in Band 1 of LTE.

The filter 11 and the filter 12 define an unbalanced duplexer 10 whose pass band is, for example, Band 3 of LTE. Further, the filter 21 and the filter 22 define an unbalanced duplexer 20 whose pass band is, for example, Band 1 of LTE. That is, the quadplexer 1 according to the present preferred embodiment has a configuration such that the common terminal Port1 is used as a common terminal (antenna terminal) of the duplexer 10 whose pass band is Band 3 of LTE and as a common terminal (antenna terminal) of the duplexer 20 whose pass band is Band 1 of LTE. In the present preferred embodiment, a signal path that passes the duplexer 10 and a signal path that passes the duplexer 20 are connected at a node N. That is, the node N is a point that bundles these two signal paths.

The frequency bands assigned to Band 1 and Band 3 of LTE, which are pass bands of the quadplexer 1 according to the present preferred embodiment, are now described. Note that hereinbelow, with regard to the range of a frequency band, the numerical range greater than or equal to A and less than or equal to B is expressed in a simplified term, such as A to B.

Figure 2:
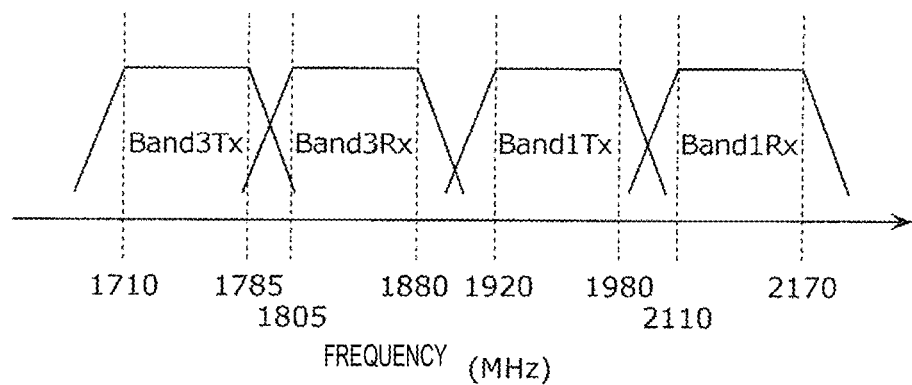
FIG. 2 is a diagram illustrating frequency bands assigned to Band 1 and Band 3.

FIG. 2 is a diagram illustrating frequency bands assigned to Band 1 and Band 3. Note that hereinafter, in some cases, "Band of LTE" may be simply described as "Band", and the reception band (Rx) and the transmission band (Tx) may be described in a simplified term such as, for example, "Band 1Rx band" for the reception band (Rx) of Band 1, by using the name of Band and letters indicating the reception band or the transmission band attached to the end of the name of Band.

As illustrated in FIG. 2, for example, in Band 1, about 1920 MHz to about 1980 MHz is assigned to the transmission band, and about 2110 MHz to about 2170 MHz is assigned to the reception band. In Band 3, about 1710 MHz to about 1785 MHz is assigned to the transmission band, and about 1805 MHz to about 1880 MHz is assigned to the reception band. Accordingly, as filter characteristics of the filters 11, 12, 21, and 22, characteristics indicated by the solid lines of FIG. 2, which allow the transmission band or the reception band of the corresponding Band to pass and attenuate the other bands, are desirable.

As described above, the quadplexer 1 includes the filter 12 on the low frequency side (first filter) and the filter 11 on the high frequency side (second filter) whose pass band is higher in frequency than the filter 12. Further, the quadplexer 1 includes the duplexer 10 including two filters (in the present preferred embodiment, the filters 11 and 12) which includes the filter 12 and the duplexer 20 including two filters (in the present preferred embodiment, the filters 21 and 22) which includes the filter 22.

Note that the pass bands of these two duplexers 10 and 20 are not limited to the combination of Band 3 and Band 1 and may be, for example, a combination of Band 25 and Band 66, a combination of Band 3 and Band 7, or the like. Further, in the quadplexer 1, an impedance element, such as an impedance matching inductor or the like, for example, may be connected in or to one of paths connecting the respective filters 11, 12, 21, and 22 to the node N or a path connecting the node N to the common terminal Port1 or the like.

2. Basic Configuration of Filter

Next, the basic configuration of each of the filters 11, 12, 21, and 21 is described using the basic configuration of the filter 12 (first filter) whose pass band is Band 3Tx as an example.

Figure 3:
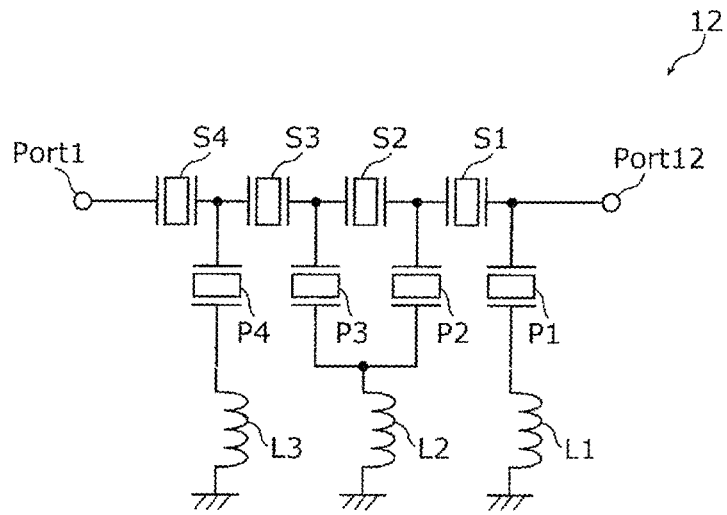
FIG. 3 is a circuit configuration diagram of a filter according to the first preferred embodiment of the present invention.

FIG. 3 is a circuit configuration diagram of the filter 12. As illustrated in FIG. 3, the filter 12 includes series resonators S1 to S4, parallel resonators P1 to P4, and inductors L1 to L3.

The series resonators S1 to S4 are connected in series from the individual terminal Port12 side in this order on a signal path (series arm) connecting the common terminal Port1 and the individual terminal Port12. Further, the parallel resonators P1 to P4 are connected in parallel to each other on paths (parallel arms) connecting respective connecting points between the individual terminal Port12 and the series resonators S1 to S4 to a reference terminal (ground). Specifically, the parallel resonator P1 is connected to the reference terminal via the inductor L1, the parallel resonators P2 and P3 are connected to the reference terminal via the inductor L2, and the parallel resonator P4 is connected to the reference terminal via the inductor L3. Because of the foregoing connection configuration of the series resonators S1 to S4 and the parallel resonators P1 to P4, the filter 12 defines a ladder band pass filter.

As described above, the filter 12 (first filter) has a ladder filter structure that includes two or more series resonators (in the present preferred embodiment, for example, four series resonators S1 to S4) on a signal path and one or more parallel resonators (in the present preferred embodiment, for example, four parallel resonators P1 to P4) each on a path connecting the signal path and the reference terminal (ground).

Note that each of the numbers of the series resonators and the parallel resonators of the filter 12 is not limited to four. The number of the series resonators may be any number greater than or equal to two, and the number of the parallel resonators may be any number greater than or equal to one.

Further, the parallel resonators P1 to P4 may be directly connected to the reference terminal without the inductors L1 to L3 interposed therebetween. Further, impedance elements such as, for example, an inductor, a capacitor, and the like may be inserted in or connected to the series arm or the parallel arm.

Further, in FIG. 3, a common terminal is used for the reference terminal (ground) to which the parallel resonator P2 and P3 are both connected, and individual terminals are used for the reference terminals to which the parallel resonator P1 and P4 are connected, respectively. However, the reference terminal defining and functioning as the common terminal and the reference terminal defining and functioning as the individual terminal are not limited to the above and may be arbitrary selected depending on constraints of the mounting layout of the filter 12.

Further, a parallel resonator may be connected to a common terminal Port1 side node of the series resonator S4, which is the resonator closest to the common terminal Port1 in the series resonators S1 to S4 defining a ladder filter structure. Further, the parallel resonator P1 connected to an individual terminal Port12 side node of the series resonator S1, which is the closest to the individual terminal Port12, may be omitted.

3. Basic Structure of Resonator

Next, the basic structure of each resonator (series resonator and parallel resonator) of the filter 12 (first filter) is described. In the present preferred embodiment, the resonator is a surface acoustic wave (SAW) resonator, for example.

Note that the configurations of the other filters 11, 21, and 22 are not limited to the configuration described above and may be arbitrary designed depending on desired filter characteristics and the like. Specifically, the filters 11, 21, and 22 may not have a ladder filter structure and may have, for example, a longitudinally coupled filter structure. Further, each of the resonators of the filters 11, 21, and 22 is not limited to a SAW resonator and may alternatively be a bulk acoustic wave (BAW) resonator, for example. Furthermore, the filters 11, 21, and 22 may be configured without using any resonator and may alternatively be, for example, a LC resonant filter or a dielectric filter.

Figure 4:
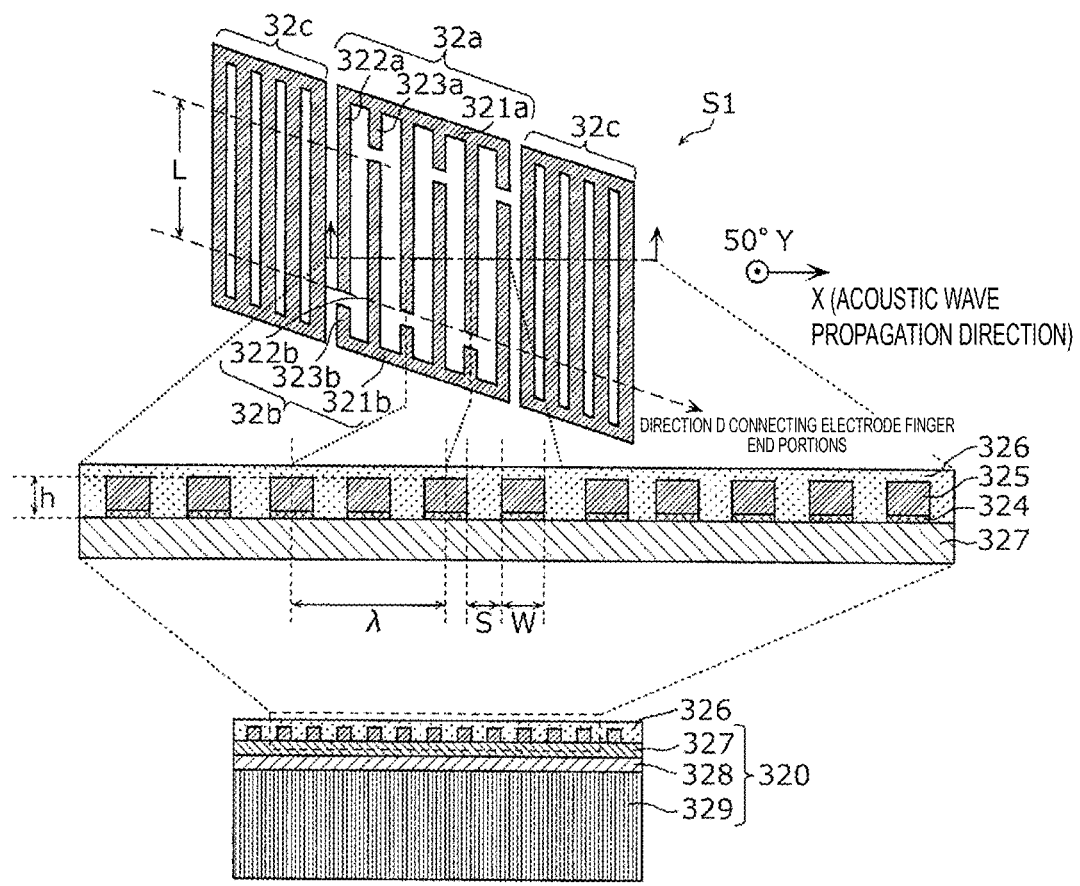
FIG. 4 is a plan view and a cross-sectional view schematically illustrating a resonator according to the first preferred embodiment of the present invention.

FIG. 4 is a plan view and a cross-sectional view schematically illustrating a resonator of the filter 12 according to the present preferred embodiment. In FIG. 4, as an exemplification of a plurality of resonators of the filter 12, a schematic plan view and schematic cross-sectional views illustrating the structure of the series resonator S1 are shown. Note that the series resonator S1 illustrated in FIG. 4 is provided for illustrating a typical structure of the plurality of resonators, and the number, the length, and the like of the electrode fingers of the electrode are not limited to the ones illustrated in FIG. 4. Further, although it is not illustrated in FIG. 4, the electrode finger may alternatively be a variant finger including a variant portion on a top portion thereof.

As illustrated in the plan view of FIG. 4, the series resonator S1 includes a pair of comb-shaped electrodes 32a and 32b facing each other and reflectors 32c along an acoustic wave propagation direction for the pair of comb-shaped electrodes 32a and 32b. The pair of comb-shaped electrodes 32a and 32b define an IDT (InterDigital Transducer) electrode. Note that depending on constraints of the mounting layout or the like, one of the pair of the reflectors 32c may not need to be provided.

The comb-shaped electrode 32a includes a plurality of electrode fingers 322a and a plurality of offset electrode fingers 323a, which are parallel to each other and arranged in a comb shape, and a busbar electrode 321a that connects one-side end portions of respective ones of the plurality of electrode fingers 322a and one-side end portions of respective ones of the plurality of offset electrode fingers 323a. Further, the comb-shaped electrode 32b is formed from a plurality of electrode fingers 322b and a plurality of offset electrode fingers 323b, which are parallel or substantially parallel to each other and have a comb shape, and a busbar electrode 321b that connects one-side end portions of respective ones of the plurality of electrode fingers 322b and one-side end portions of respective ones of the plurality of offset electrode fingers 323b. The pluralities of electrode fingers 322a and 322b and the pluralities of offset electrode fingers 323a and 323b extend in an orthogonal or substantially orthogonal direction to the acoustic wave propagation direction (X-axis direction). Further, the electrode finger 322a and the offset electrode finger 323b face each other in the orthogonal or substantially orthogonal direction, and the electrode finger 322b and the offset electrode finger 323a face each other in the orthogonal or substantially orthogonal direction.

Here, a direction D connecting the other-side end portions of respective ones of the plurality of electrode fingers 322a (end portions of respective ones of the plurality of electrode fingers 322a that are not connected to the busbar electrode 321a) crosses the acoustic wave propagation direction (X-axis direction) at a predetermined angle. Further, the direction D connecting the other-side end portions of respective ones of the plurality of electrode fingers 322b (end portions of the plurality of electrode fingers 322b that are not connected to the busbar electrode 321b) crosses the acoustic wave propagation direction (X-axis direction) at the predetermined angle. According to this shape, each of the IDT electrodes of the series resonators S1 to S4 and the parallel resonators P1 to P4 is a slanted IDT in which the acoustic wave propagation direction crosses a direction along which the plurality of electrode fingers are lined up.

In a one-port resonator that utilizes surface acoustic waves and includes a piezoelectric layer, there may be a case where transverse mode ripples are produced between a resonant frequency and an anti-resonant frequency and a transmission characteristic in a pass band degrades. In the filter 12 according to the present preferred embodiment, to counteract such issue, the slanted IDT is provided as an IDT electrode of each resonator.

The pair of the reflectors 32c are provided along the direction D with respect to the pair of the comb-shaped electrodes 32a and 32b. Specifically, the pair of the reflectors 32c sandwich the pair of the comb-shaped electrodes 32a and 32b in the direction D. Each reflector 32c includes a plurality of reflector electrode fingers in parallel or substantially in parallel to each other and reflector busbar electrodes that connect the plurality of reflector electrode fingers. The pair of the reflectors 32c configured such that the reflector busbar electrodes are aligned in the direction D.

The pair of the reflectors 32c confine a standing wave of an acoustic wave to be propagated without leaking to the outside of the resonator (here, the series resonator S1). This enables the resonator to propagate a radio frequency signal in a pass band, which is defined by the electrode pitch, the number of pairs, the intersecting width, and the like of the pair of the comb-shaped electrodes 32a and 32b, with low loss and to highly attenuate a radio frequency signal in the outside of the pass band.

Further, the IDT electrode including the plurality of the electrode fingers 322a and 322b, the plurality of the offset electrode fingers 323a and 323b, and the busbar electrodes 321a and 321b has a multilayer structure including an adhesive layer 324 and a primary electrode layer 325 as illustrated in the cross-sectional view of FIG. 4. Further, the cross-sectional structure of the reflector 32c is the same or substantially the same as the cross-sectional structure of the IDT electrode, and thus the description thereof is omitted in the following description.

The adhesive layer 324 improves adhesiveness between a piezoelectric layer 327 and the primary electrode layer 325, and as a material therefor, for example, Ti may be used. The film thickness of the adhesive layer 324 is, for example, about 12 nm.

For the primary electrode layer 325, as a material, for example, Al including 1% of Cu may be used. The film thickness of the primary electrode layer 325 is, for example, about 162 nm.

A protective layer 326 covers the IDT electrode. The protective layer 326 protects the primary electrode layer 325 from an external environment, adjusts a frequency-temperature characteristic, improves moisture resistance performance, and the like, and is a film whose main component is, for example, silicon dioxide. The film thickness of the protective layer 326 is, for example, about 25 nm.

Note that the materials for the adhesive layer 324, the primary electrode layer 325, and the protective layer 326 are not limited to the materials described above. Further, the IDT electrode does not need to have the foregoing multilayer structure. The IDT electrode may be made of, for example, a metal such as Ti, Al, Cu, Pt, Au, Ag, Pd, or the like or an alloy thereof, or may include a plurality of multilayer bodies made of the metal or the alloy described above. Further, the protective layer 326 may not need to be provided.

Such IDT electrode and the reflectors 32c are provided on a principal surface of a substrate 320, which will be described in the next section. The multilayer structure of the substrate 320 is described below.

As shown in the lower portion of FIG. 4, the substrate 320 includes a high acoustic velocity support substrate 329, a low acoustic velocity film 328, and the piezoelectric layer 327, and has a structure in which the high acoustic velocity support substrate 329, the low acoustic velocity film 328, and the piezoelectric layer 327 are stacked on top of each other in this order.

The piezoelectric layer 327 is a piezoelectric film on a principal surface of which the IDT electrode and the reflectors 32c are provided. For example, the piezoelectric layer 327 is made of 50° Y-cut X-propagation $LiTaO_3$ piezoelectric single crystal or piezoelectric ceramics (lithium tantalate single crystal or ceramics that is cut at a surface whose normal line is an axis obtained by rotating from the Y axis by about 50° about the X-axis serving as the center axis, wherein a surface acoustic wave propagates in the X-axis direction on this single crystal or ceramics). The thickness of the piezoelectric layer 327 is, for example, less than or equal to about 3.5λ where λ is the wavelength of an acoustic wave defined by the electrode pitch of the IDT electrode, and is about 600 nm, for example.

The high acoustic velocity support substrate 329 is a substrate that supports the low acoustic velocity film 328, the piezoelectric layer 327, and the IDT electrode. Further, the high acoustic velocity support substrate 329 is a substrate such that the acoustic velocity of a bulk wave in the high acoustic velocity support substrate 329 is higher than the acoustic velocities of an acoustic wave such as a surface wave or a boundary wave propagating through the piezoelectric layer 327, and confines a surface acoustic wave in a portion where the piezoelectric layer 327 and the low acoustic velocity film 328 are stacked on top of each other and prevents the surface acoustic wave from leaking downward below the high acoustic velocity support substrate 329. The high acoustic velocity support substrate 329 is, for example, a silicon substrate and has a thickness of, for example, about 125 μm. Note that the high acoustic velocity support substrate 329 may be made of, for example, any one of (1) a piezoelectric body such as silicon carbide, silicon, lithium tantalate, lithium niobite, crystal, or the like, (2) various ceramics such as alumina, sapphire, zirconia, cordierite, mullite, steatite, forsterite, or the like, (3) magnesia or diamond, (4) a material whose main component is one of the foregoing materials, and (5) a material whose main component is a mixture of one of the foregoing materials.

The low acoustic velocity film 328 is a film such that the acoustic velocity of a bulk wave in the low acoustic velocity film 328 is lower than the acoustic velocity of a bulk wave propagating through the piezoelectric layer 327 and is between the piezoelectric layer 327 and the high acoustic velocity support substrate 329. According to this structure and the property that energy of an acoustic wave is focused in a medium where the acoustic velocity is inherently low, the leakage of surface acoustic wave energy to the outside of the IDT electrode is reduced or prevented. The low acoustic velocity film 328 is, for example, a film whose main component is silicon dioxide. The thickness of the low acoustic velocity film 328 is, for example, less than or equal to about 2λ where λ is the wavelength of an acoustic wave defined by the electrode pitch of the IDT electrode, and is about 670 nm, for example.

According to the foregoing multilayer structure of the substrate 320, it becomes possible to substantially increase the Q factor at a resonant frequency and an anti-resonant frequency compared with a known structure in which a single layer of a piezoelectric substrate is used. That is, because a high Q factor surface acoustic wave resonator may be obtained, it becomes possible to provide a filter having a low insertion loss using this surface acoustic wave resonator.

Note that the high acoustic velocity support substrate 329 may alternatively have a structure in which a support substrate and a high acoustic velocity film are stacked on top of each other, the high acoustic velocity film being such that the acoustic velocity of a bulk wave propagating therethrough is higher than the acoustic velocities of acoustic waves such as a surface wave and a boundary wave propagating through the piezoelectric layer 327. In this case, as the support substrate, a piezoelectric body such as, for example, lithium tantalate, lithium niobite, crystal, and the like, various ceramics such as alumina, magnesia, silicon nitride, aluminum nitride, silicon carbide, zirconia, cordierite, mullite, steatite, forsterite, and the like, a dielectric body such as glass, sapphire, and the like, a semiconductor such as silicon, gallium nitride, and the like, and a resin substrate and the like may be used. Further, for the high acoustic velocity film, various high acoustic velocity materials such as, for example, aluminum nitride, aluminum oxide, silicon carbide, silicon nitride, silicon oxynitride, a DLC film, diamond, a medium whose main component is one of the foregoing materials, a medium whose main component is a mixture of one of the foregoing materials, or the like may be used.

Note that in the present preferred embodiment, an example is described using the case where the IDT electrode of the filter 12 is provided on the substrate 320 including the piezoelectric layer 327. However, the substrate on which the IDT electrode is to be provided may alternatively be a piezoelectric substrate including a single layer of the piezoelectric layer 327. The piezoelectric substrate in this case is made of, for example, a piezoelectric single crystal of $LiTaO_3$ or another piezoelectric single crystal such as $LiNbO_3$ or the like.

Further, for the substrate on which the IDT electrode of the filter 12 is provided, beside one that is entirety is made of a piezoelectric layer, any structure in which a piezoelectric layer is stacked on a support substrate may also be used as long as the substrate includes a piezoelectric layer.

Further, the piezoelectric layer 327 according to the foregoing present preferred embodiment uses 50° Y-cut X-propagation $LiTaO_3$ single crystal. However, the cut angle of a single crystal material is not limited thereto. That is, depending on desired band pass characteristics of an acoustic wave filter device, the multilayer structure, the material, and the thickness may be changed as needed, and even with a surface acoustic wave filter that uses a $LiTaO_3$ piezoelectric substrate having a cut angle other than the above, a $LiNbO_3$ piezoelectric substrate, or the like, the same or substantially the same advantageous effects may be produced.

Here, electrode parameters of the IDT electrode of a surface acoustic wave resonator will be described.

The wavelength of a surface acoustic wave resonator is defined by a wavelength λ, which is a repetition period of the plurality of electrode fingers 322a or the plurality of electrode fingers 322b that forms the IDT electrode illustrated in the middle part of FIG. 4. Further, the electrode pitch is ½ of the wavelength λ and is defined as (W+S), where W is the line width of the electrode fingers 322a and 322b of the comb-shaped electrodes 32a and 32b, and S is the space width between the electrode finger 322a and the electrode finger 322b, which are adjacent to each other. Further, as illustrated in the top portion of FIG. 4, the intersecting width L of a pair of the comb-shaped electrodes 32a and 32b is the overlapping length of the electrode fingers when viewed from the direction D of the electrode finger 322a and the electrode finger 322b. Further, the electrode duty of each resonator is a line width share of the pluralities of electrode fingers 322a and 322b and is defined as W/(W+S), which is a ratio of the line width of the pluralities of electrode fingers 322a and 322b to the sum of this line width and the space width of the pluralities of electrode fingers 322a and 322b.

Note that in the above, an example is described using the case where the series resonator S1 includes a slanted IDT. However, the present preferred embodiment is not limited thereto, and all of the series resonators and the parallel resonators may include a slanted IDT, or only the series resonators may include a slanted IDT.

Further, in the above, an example is described using the case where the series resonator S1 includes the offset electrode fingers. However, the present preferred embodiment is not limited thereto, and all of the series resonators and the parallel resonators may include one or more offset electrode fingers, or one or more of the resonators may include no offset electrode finger.

4. Resonator Structure in Filter According to Reference Example

As described above, in a resonator including a slanted IDT electrode portion, ripples may be produced near a resonant frequency. Such ripples near a resonant frequency may be reduced or prevented by using a resonator in which variant fingers are used as electrode fingers in the slanted IDT electrode portion. However, it is likely to have ripples near an anti-resonant frequency.

In view of the above, first, for the series resonators S1 to S4 of the filter 12 of FIG. 3, reference examples 1 to 4 are set to compare characteristics. The reference examples 1 to 4 are each configured such that all of the electrode fingers including the offset electrode fingers are the variant finger or all of the electrode fingers including the offset electrode fingers are not the variant finger.

Figures 5A, 5B:
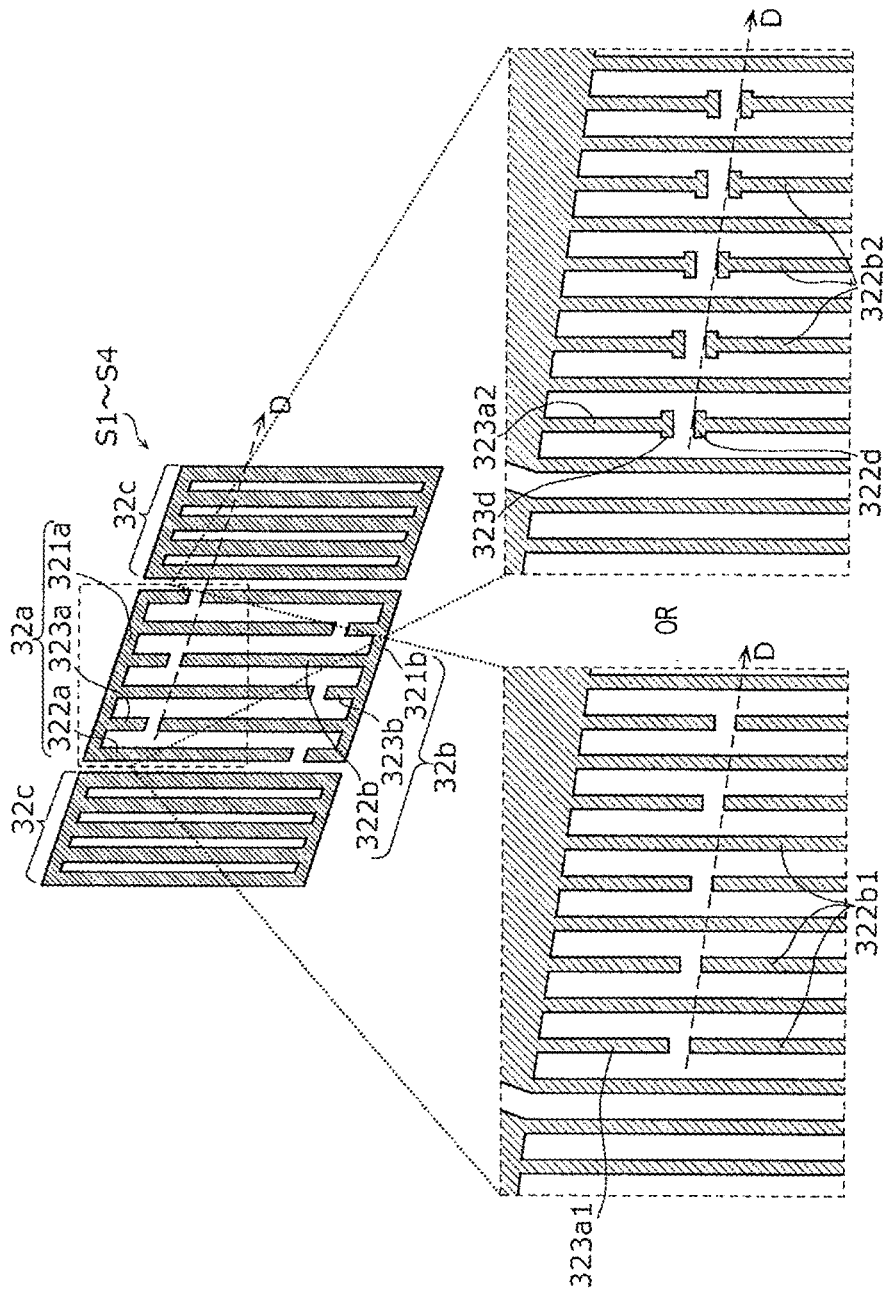
FIGS. 5A and 5B are plan views of an IDT electrode of a series resonator in a filter according to a reference example.

FIGS. 5A and 5B are plan views of the IDT electrode of the series resonators S1 to S4 of the filter 12 according to the reference examples 1 to 4.

In the filters 12 according to the reference examples 1 to 4, in each of the series resonators S1 to S4, all of the electrode fingers 322a and 322b and the offset electrode fingers 323a and 323b are either not the variant finger (FIG. 5A) or the variant finger (FIG. 5B). Here, the variant finger is, of a plurality of electrode fingers, an electrode finger with a wider electrode finger width at an end portion that is not connected to a busbar electrode than the electrode finger width at an electrode finger center portion (that is, having a variant portion).

As illustrated in FIG. 5A, in the resonator in which all of the electrode fingers are not the variant finger, all of the offset electrode fingers 323a1 and the electrode fingers 322b1 are a second electrode finger such that the electrode finger width at one end portion is less than or equal to the electrode finger width at a center portion. In this resonator, all of the electrode fingers 322a and the offset electrode fingers 323b are also the second electrode finger (not illustrated).

On the other hand, as illustrated in FIG. 5B, in the resonator in which all of the electrode fingers are the variant finger, all of the offset electrode fingers 323a2 and the electrode fingers 322b2 include variant portions 323d and 322d, respectively, and are a first electrode finger such that the electrode finger width at one end portion is wider than the electrode finger width at a center portion. In this resonator, all of the electrode fingers 322a and the offset electrode fingers 323b are also the first electrode finger (not illustrated).

Table 1 indicates the arrangement of the resonators in which all of the electrode fingers (including the offset electrode fingers) are the variant finger in the reference examples 1 to 4. In the following description, the shape of an electrode finger (including an offset electrode finger) that does not include the variant portion is expressed by using the phrase "the variant portion is removed". This phrase is only used to make a distinction between the shape of an electrode finger that does not include the variant portion and the shape of the variant finger, and does not limit the procedure of fabrication. That is to say, the electrode finger in which a variant portion is removed may be an electrode finger formed by patterning a shape that does not originally include the variant portion.

Table 1 represents the removal ratio of variant portion for each resonator of the reference examples 1 to 4. In Table 1, that the removal ratio of variant portion is 0% means that all of the electrode fingers (including the offset electrode fingers) of a resonator are the variant finger, and that the removal ratio of variant portion is 100% means that all of the electrode fingers (including the offset electrode fingers) of a resonator do not include the variant portion.

TABLE 1

| Removal ratio of variant portion | Resonator S4 | Resonator S3 | Resonator S2 | Resonator S1 |
| --- | --- | --- | --- | --- |
| Reference example 1 | 0% | 0% | 0% | 0% |
| Reference example 2 | 0% | 100% | 0% | 0% |
| Reference example 3 | 100% | 100% | 100% | 100% |
| Reference example 4 | 0% | 100% | 0% | 100% |

5. Characteristic Comparison of Quadplexer Using Filters According to Reference Example The band pass characteristics and the isolation characteristics of the quadplexers 1 (hereinafter, simply referred to as reference examples 1 to 4) are described, in which the filters of the respective reference examples 1 to 4 are used as the filter 12.

First, the reference example 1 is described.

Figure 6:
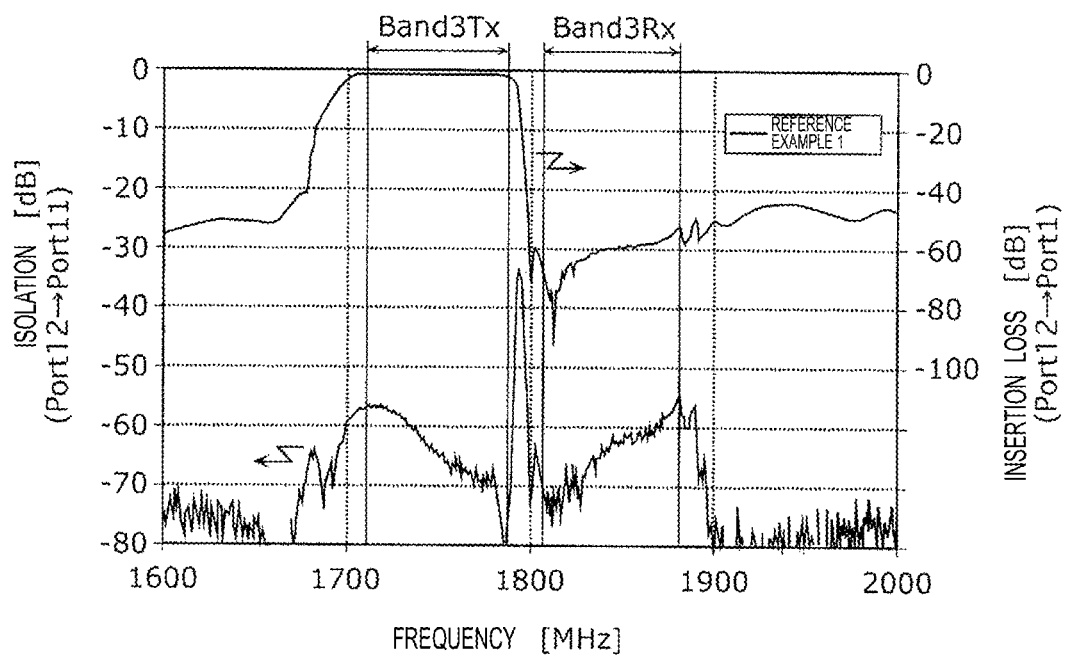
FIG. 6 is a graph illustrating the band pass characteristic and the isolation characteristic of a quadplexer that uses the filter according to the reference example.

FIG. 6 is a graph illustrating examples of the band pass characteristic between the individual terminal Port12 and the common terminal Port1 and the isolation characteristic between the individual terminal Port12 and the individual terminal Port11 in the reference example 1.

Specifically, FIG. 6 illustrates the band pass characteristic of a path that goes through the filter 12 (filter for Band 3Tx) and the isolation characteristic between paths that go through the filter 12 and the filter 11 (filter for Band 3Rx). More specifically, FIG. 6 illustrates the insertion loss which is the ratio of the intensity of a signal output from the common terminal Port1 to the intensity of a signal input to the individual terminal Port12 and the isolation which is the ratio of the intensity of a signal output from the individual terminal Port11 to the intensity of a signal input to the individual terminal Port12.

In both of the band pass characteristic and the isolation characteristic illustrated in FIG. 6, ripples are observed in a high frequency end region of the reception band (Band 3Rx) of Band 3. These ripples coincide in frequency with ripples near an anti-resonant frequency (not illustrated) in the characteristic of the filter 12 of the reference example 1 alone. Therefore, it is clear that these ripples are caused by the filter 12.

As described above, the use of the filter 12 in which all of the electrode fingers (including the offset electrode fingers) of all of the resonators are the variant finger in the quadplexer 1 may cause degradation in characteristics of a pass band in another filter (for example, the filter 11).

Figure 7A:
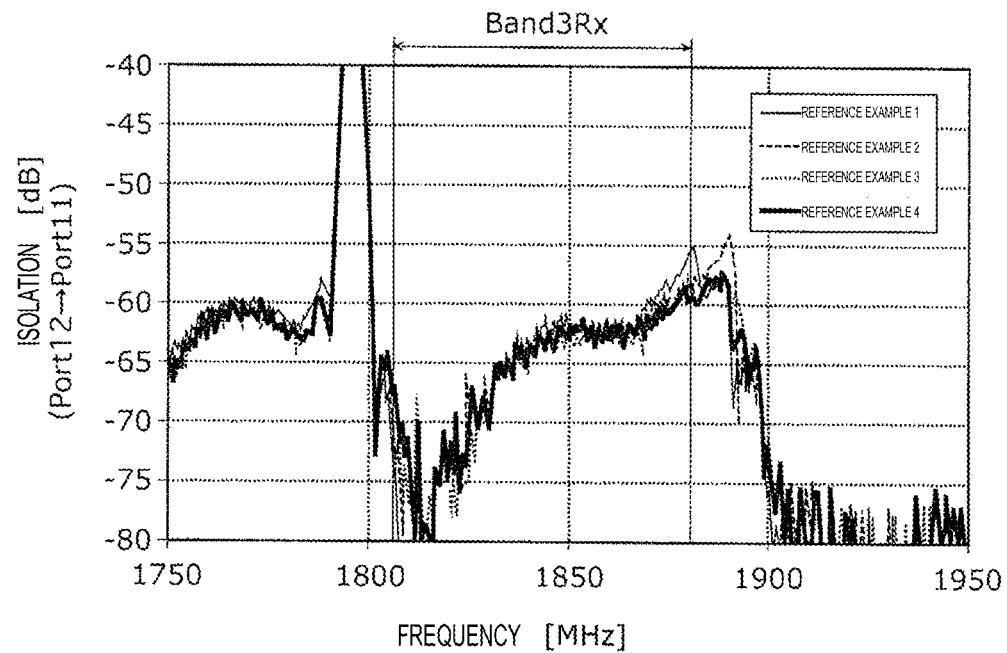
FIG. 7A is an enlarged graph illustrating the isolation characteristics of quadplexers that use filters according to reference examples.

FIG. 7A is an enlarged graph illustrating an example of the isolation characteristic between the individual terminal Port12 and the individual terminal Port11 in the reference examples 1 to 4.

Figure 7B:
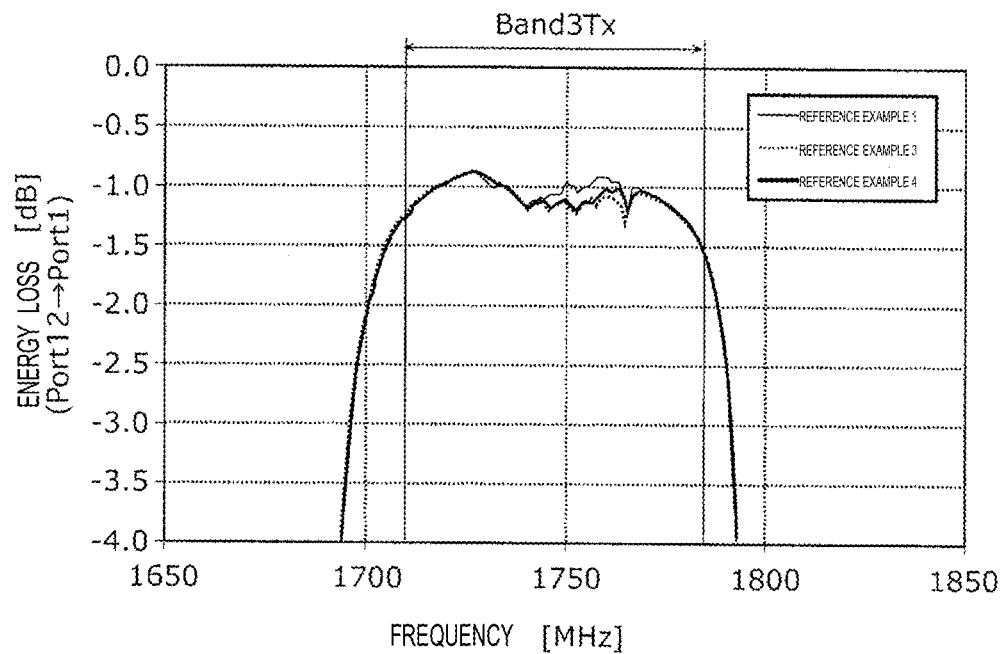
FIG. 7B is an enlarged graph illustrating the energy losses of quadplexers that use filters according to reference examples.

FIG. 7B is an enlarged graph illustrating an example of the energy loss between the individual terminal Port12 and the common terminal Port1 in the reference examples 1, 3, and 4. Here, the energy loss means power consumption in a path, which is obtained by removing matching loss from passage loss.

Contrary to the reference example 1, in the reference example 3, the variant portion is removed from all of the electrode fingers (including the offset electrode fingers) of all of the resonators in the filter 12. In the reference example 3, although ripples in the isolation characteristic in a high frequency end region of Band 3Rx are small, the energy loss in Band 3Tx is large.

Further, in the reference example 2, in the filter 12, the variant portion is removed from all of the electrode fingers (including the offset electrode fingers) of the series resonator S2, and all of the electrode fingers (including the offset electrode fingers) of the series resonators S1, S3, and S4 include the variant portion. In the reference example 2, in the isolation characteristic, ripples of the same or substantially the same level as in the reference example 1 are produced in a high frequency end region of Band 3Rx.

Further, in the reference example 4, in the filter 12, the variant portion is removed from all of the electrode fingers (including the offset electrode fingers) of the series resonators S2 and S4, and all of the electrode fingers (including the offset electrode fingers) of the series resonators S1 and S3 include the variant portion. In the reference example 4, although ripples in the isolation characteristic in a high frequency end region of Band 3Rx are similarly small as in the reference example 3, the energy loss in Band 3Tx is larger compared with the reference example 1.

As described above, the issue of the reference example 1 may not be resolved by the reference example 2 in which the removal ratio of variant portion is set to 100% only in one of the series resonators (here, the series resonator S2), and the same issue as in the reference example 3 arises in the reference example 4 in which the removal ratio of variant portion is set to 100% in two of the series resonators (here, the series resonators S2 and S4).

That is to say, an excellent characteristic in both of the loss in a pass band and the ripples near an anti-resonant frequency may not be achieved by setting the removal ratio of variant portion to 0% (no removal) or 100% (complete removal) in each resonator.

6. Configuration of Filter According to Working Example

In view of the above, the inventors of preferred embodiments of the present invention studied a configuration in which the removal ratio of variant portion is set to an intermediate value which is greater than 0% and less than 100% (in other words, thinning the variant portions) in the series resonators S1 and S3 and to 0% (no removal) in the series resonators S2 and S4. Specifically, filters in which the removal ratio of variant portion in both of the series resonators S1 and S3 is about 30%, about 50%, and about 75% are defined as working examples 1, 2, and 3, respectively.

In the working examples 1, 2, and 3, the series resonators S2 and S4 are examples of the second series resonator including the first electrode fingers each including the variant portion, and the series resonators S1 and S3 are examples of the first series resonator including the first electrode fingers each including the variant portion and the second electrode fingers including no variant portion.

Note that in the working examples 1 and 2, for ease of explanation, it is assumed that the second series resonator (series resonators S2 and S4) include only the first electrode fingers (the removal ratio is 0%). However, the present preferred embodiment is not limited thereto, and the second series resonator may alternatively include, for example, several second electrode fingers.

Figure 8B:
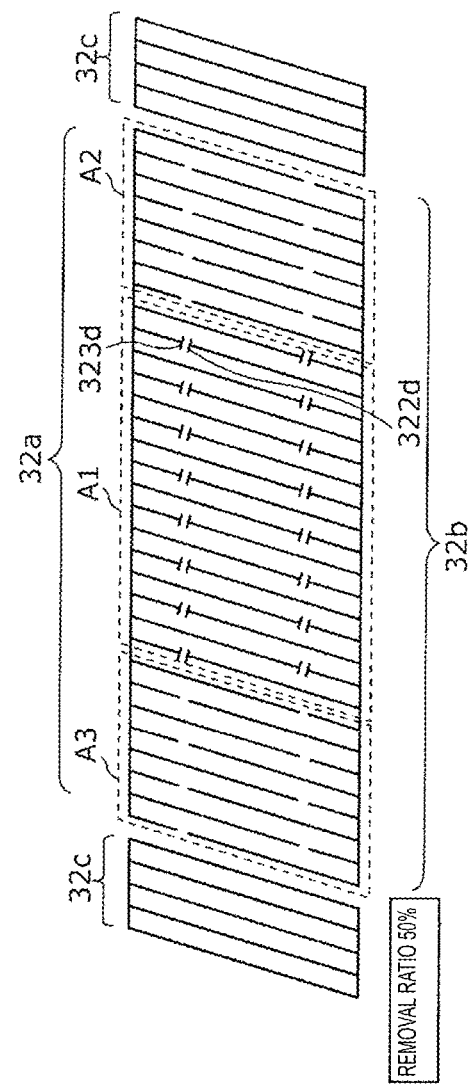
FIG. 8B is a plan view illustrating another exemplary arrangement of the first electrode finger and the second electrode finger in the IDT electrode of the filter according to the working example of a preferred embodiment of the present invention.
Figure 8C:
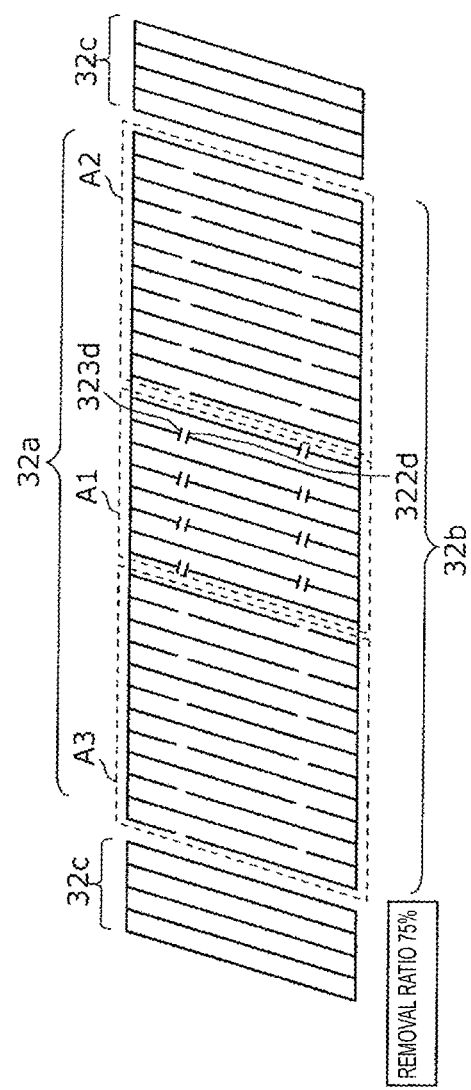
FIG. 8C is a plan view illustrating another exemplary arrangement of the first electrode finger and the second electrode finger in the IDT electrode of the filter according to the working example of a preferred embodiment of the present invention.

FIGS. 8A to 8C are plan views illustrating examples of the IDT electrode of the series resonators S1 and S3 in the filters 12 according to the working examples 1, 2 and 3 of a preferred embodiment of the present invention, respectively, and each illustrate the configuration illustrated in FIGS. 5A and 5B in a simpler form for the entirety of the comb-shaped electrodes 32a and 32b. FIGS. 8A to 8C illustrate examples of the arrangement of the variant portions 322d and 323d, in which the removal ratios of variant portion are about 30%, about 50%, and about 75%, respectively. Here, the removal ratio of variant portion is a ratio of the electrode fingers and the offset electrode fingers that do not include the variant portion to all of the electrode fingers and the offset electrode fingers of the IDT electrode.

In all of the examples of FIGS. 8A to 8C, the variant portion is not removed in a first portion A1 that is centrally located in the IDT electrode in the acoustic wave propagation direction, and the variant portion is removed in a second portion A2 and a third portion A3 that are located on the two sides of the first portion A1 in the acoustic wave propagation direction. That is, the first portion A1 includes only the first electrode fingers (variant fingers), and the second portion A2 and the third portion A3 include only the second electrode fingers (fingers having no variant portion). The second portion A2 and the third portion A3 are each a portion of the IDT electrode sandwiched between the first portion A1 and the reflector 32c.

In the example of FIG. 8A, the variant portion is removed from five electrode fingers (about 15% of a total of 32 electrode fingers) in each of the second portion A2 and the third portion A3. Thus, the removal ratio of variant portion in the IDT electrode as a whole is about 30%. In FIG. 8B, the variant portion is removed from eight electrode fingers (about 25%) in each of the second portion A2 and the third portion A3. Thus, the removal ratio of variant portion in the IDT electrode as a whole is about 50%. In FIG. 8C, the variant portion is removed from twelve electrode fingers (about 37.5%) in each of the second portion A2 and the third portion A3. Thus, the removal ratio of variant portion in the IDT electrode as a whole is about 75%.

7. Characteristic Comparison of Quadplexer Using Filters According to Working Example Next, the band pass characteristics and the isolation characteristics of quadplexers 1 (hereinafter, simply referred to as working examples 1, 2, and 3) that include the respective filters according to the working examples 1, 2, and 3 as the filter 12 are described.

Figure 9A:
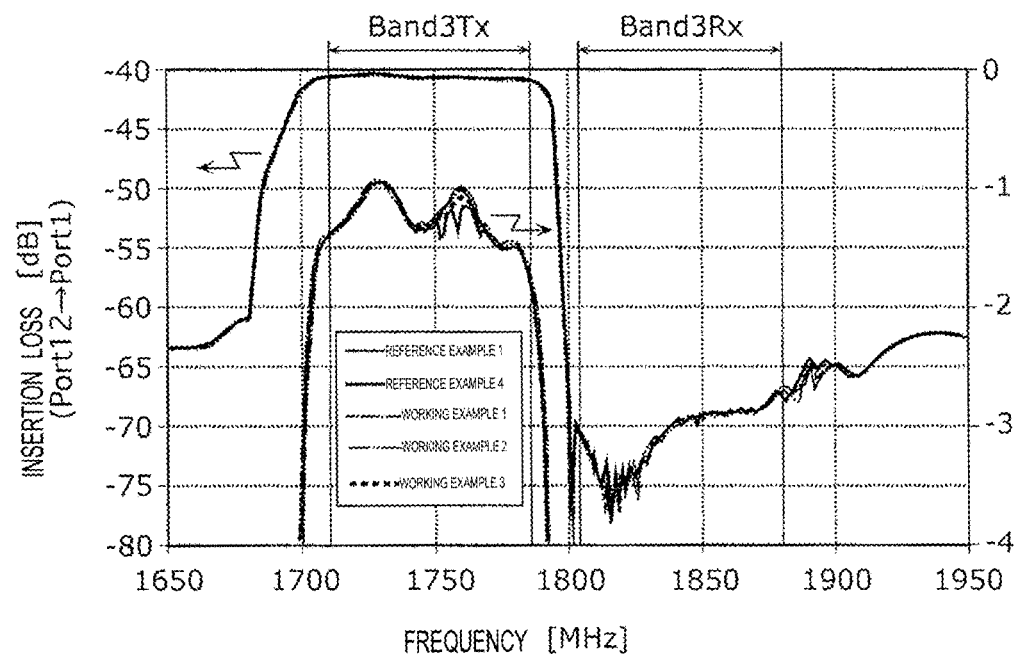
FIG. 9A is a graph illustrating the band pass characteristics of quadplexers that use filters according to working examples of a preferred embodiment of the present invention alongside those of reference examples.

FIG. 9A is a graph illustrating examples of the band pass characteristic between the individual terminal Port12 and the common terminal Port1 in the working examples 1, 2, and 3 comparing with the reference examples 1 and 4. Specifically, FIG. 9A illustrates the band pass characteristic of a path that goes through the filter 12 (filter for Band 3Tx). More specifically, FIG. 9A illustrates the insertion loss which is the ratio of the intensity of a signal output from the common terminal Port1 to the intensity of a signal input to the individual terminal Port12.

Figure 9B:
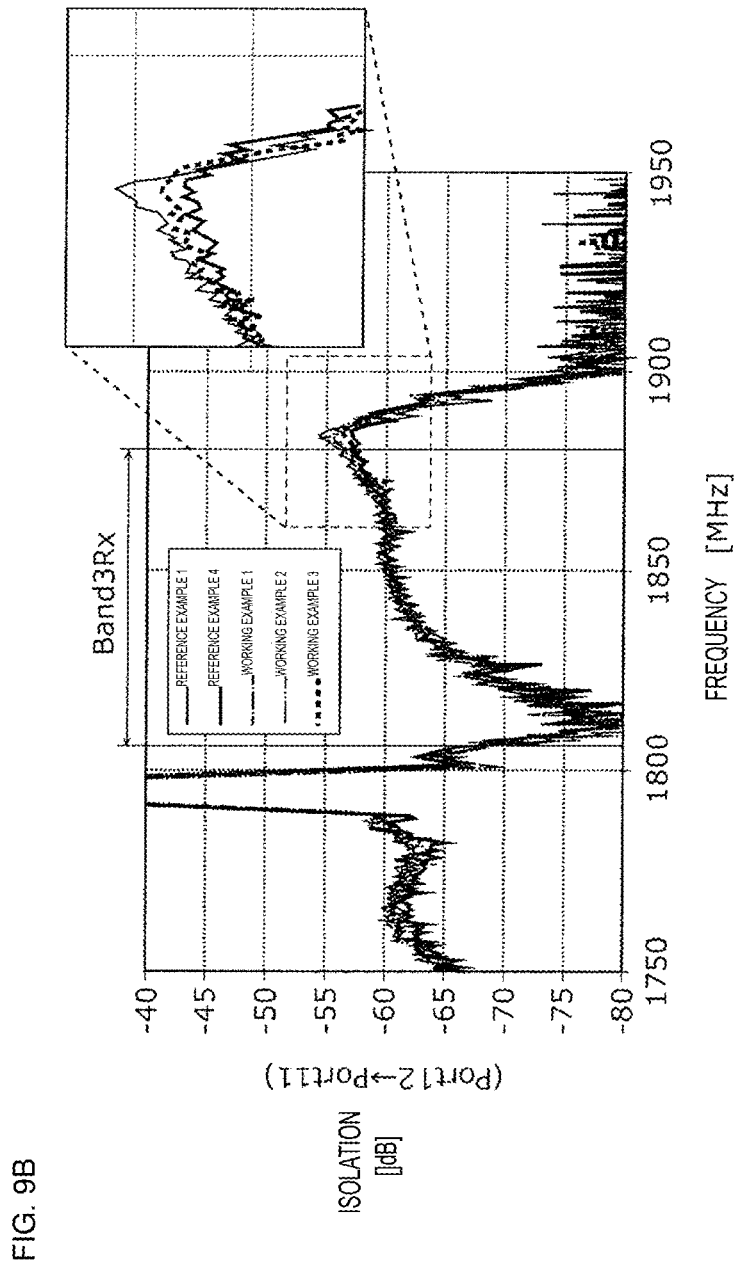
FIG. 9B is a graph illustrating the isolation characteristics of quadplexers that use filters according to the working examples of a preferred embodiment of the present invention alongside those of the reference examples.

FIG. 9B is a graph illustrating examples of the isolation characteristic between the individual terminal Port12 and the individual terminal Port11 in the working examples 1, 2, and 3 comparing with the reference examples 1 and 4. Specifically, FIG. 9B illustrates the isolation characteristic between paths that go through the filter 12 and the filter 11 (filter for Band 3Rx). More specifically, FIG. 9B illustrates the isolation which is the ratio of the intensity of a signal output from the individual terminal Port11 to the intensity of a signal input to the individual terminal Port12.

Figure 9C:
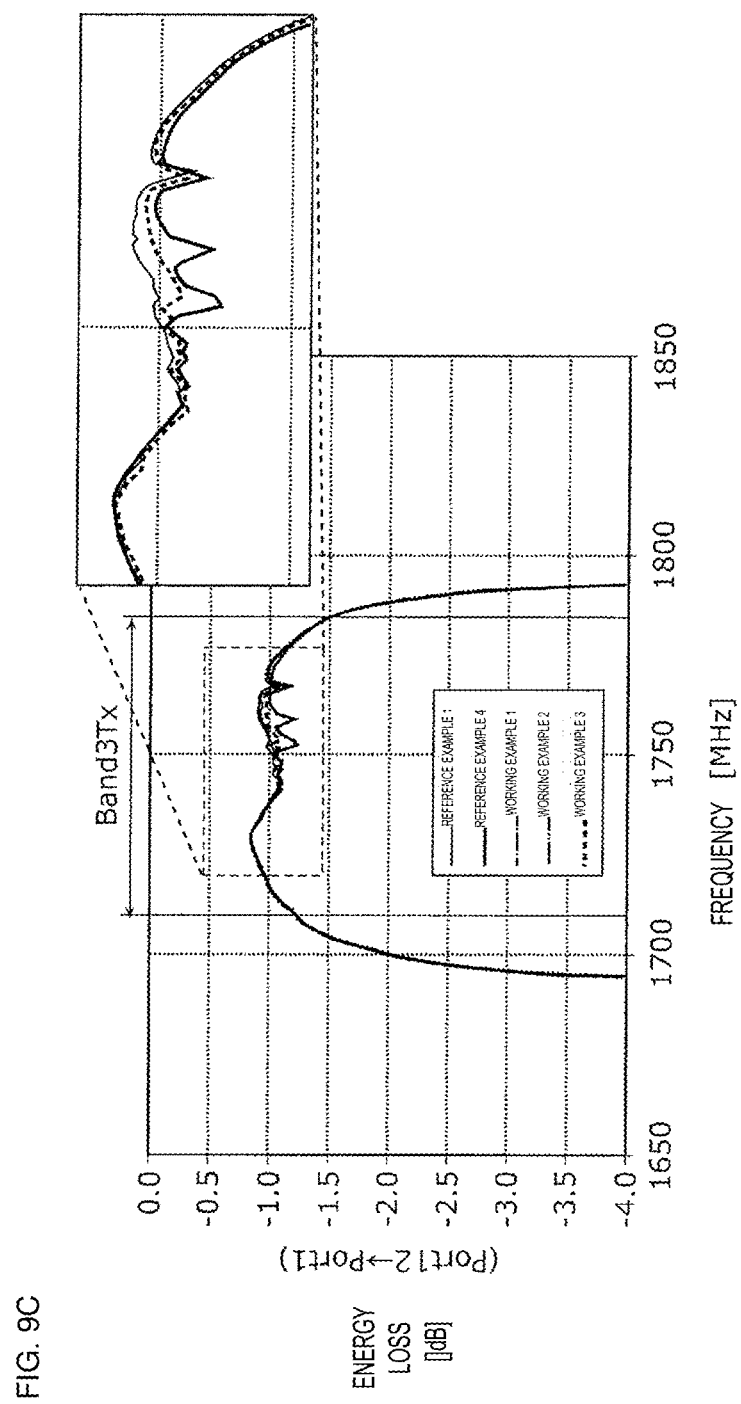
FIG. 9C is a graph illustrating the energy losses of quadplexers that use filters according to the working examples of a preferred embodiment of the present invention alongside those of the reference examples.

FIG. 9C is a graph illustrating examples of the energy loss between the individual terminal Port12 and the common terminal Port1 in the working examples 1, 2, and 3 comparing with the reference examples 1 and 4. Specifically, FIG. 9C illustrates the band pass characteristic of a path that goes through the filter 12 (filter for Band 3Tx). More specifically, FIG. 9C illustrates the power consumption in the path, which is obtained by removing matching loss from the insertion loss which is the ratio of the intensity of a signal output from the common terminal Port1 to the intensity of a signal input to the individual terminal Port12.

As shown in FIGS. 9A to 9C, large ripples are produced in the isolation characteristic in a high frequency end region of a band of Band 3Rx in the reference example 1, and the insertion loss increases in a band of Band 3Tx in the reference example 4. The increase in the insertion loss in the band of Band 3Tx in the reference example 4 is caused by the series resonators S1 and S3.

The ripples produced in the isolation characteristic in a high frequency end region of the band of Band 3Rx are the largest (worst) in the reference example 1 and become gradually smaller (better) in the working example 1, the working example 2, the working example 3, and the reference example 4 in this order. Further, the insertion loss and the energy loss in the band of Band 3Tx are both the largest (worst) in the reference example 4 and become gradually smaller (better) in the working example 3, the working example 2, the working example 1, and the reference example 1 in this order.

This result is summarized in Table 2 using the ripples produced in the isolation characteristic of the reference example and the insertion loss of the reference example 1 as the references of the ripples and the insertion loss.

As summarized in Table 2, the ripples produced in the isolation characteristic are large in the reference example 1, and the insertion loss is large in the reference example 4. Thus, these reference examples may not provide an excellent characteristic in both the isolation characteristic and the insertion loss. In contrast, having smaller ripples compared with the reference example 1 and smaller insertion loss compared with the reference example 4, the working examples 1, 2, and 3 provide an excellent characteristic in both the isolation characteristic and the insertion loss.

TABLE 2

| Removal ratio of variant portion | Resonator S4 | Resonator S3 | Resonator S2 | Resonator S1 | Ripples | Insertion loss |
| --- | --- | --- | --- | --- | --- | --- |
| Reference example 1 | 0% | 0% | 0% | 0% | X | ◎ |
| Reference example 4 | 0% | 100% | 0% | 100% | ◎ | X |
| Working example 1 | 0% | 30% | 0% | 30% | ○ | ○ |
| Working example 2 | 0% | 50% | 0% | 50% | ○ | ○ |
| Working example 3 | 0% | 75% | 0% | 75% | ○ | ○ |

From this result, it is possible to provide a filter with both smaller ripples and smaller insertion loss by configuring one or more series resonators of a plurality of series resonators of the filter in such a manner to provide the first portion of the IDT electrode centrally located in the acoustic wave propagation direction only using the first electrode fingers and provide the second portion and the third portion arranged on the two sides of the first portion only using the second electrode fingers.

The series resonator in which the first portion of the IDT electrode including only the first electrode fingers and the second portion and the third portion including only the second electrode fingers may be used as, of a plurality of series resonators forming a filter, a series resonator that is not the series resonator having the lowest anti-resonant frequency (that is, the resonator that steepens end regions of a pass band of the filter). This provides a filter having an excellent feature for both the ripples near an anti-resonant frequency and the insertion loss without losing steepness in the band pass characteristic of the filter.

8. Configuration of Filter According to Modified Example

In the first preferred embodiment, an example is described using the configuration in which the first filter (the filter 12 in the first preferred embodiment) includes only a ladder filter structure. However, the first filter may include, in addition to a ladder filter structure, a longitudinally coupled filter structure. In view of this, in the present modified example of the first preferred embodiment, a quadplexer including a first filter having such a filter structure is described. Note that of a plurality of filters included in the quadplexer, filters other than the first filter have the same or substantially the same configurations as those in the first preferred embodiment, and thus the description thereof is omitted.

Figure 10:
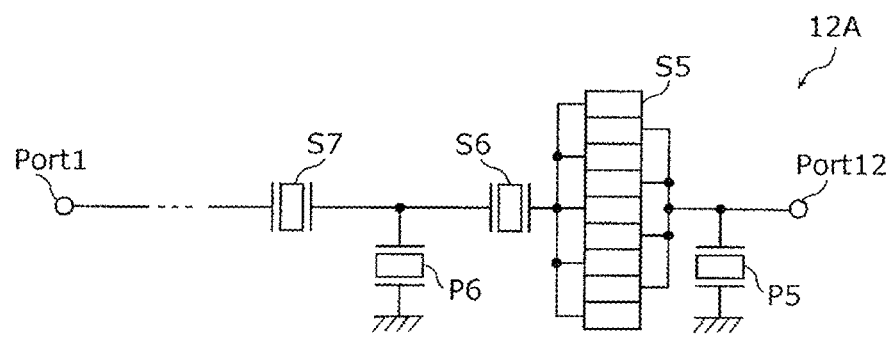
FIG. 10 is a circuit configuration diagram of a filter according to a modified example of the first preferred embodiment of the present invention.

FIG. 10 is a circuit configuration diagram of a filter 12A (first filter) according to a modified example of the first preferred embodiment.

As illustrated in FIG. 10, the filter 12A includes series resonators S6 and S7, parallel resonators P5 and P6, and a longitudinally coupled resonator S5. That is to say, the filter 12A is a filter in which the longitudinally coupled resonator S5 is added to a ladder filter structure.

The longitudinally coupled resonator S5 has a longitudinally coupled filter structure between the common terminal Port1 and the individual terminal Port12. In the present preferred embodiment, the longitudinally coupled resonator S5 is on the individual terminal Port12 side of the series resonator S6 and includes, for example, nine IDTs and reflectors on both sides thereof. Note that the location where the longitudinally coupled resonator S5 is to be provided is not limited to the above, and may be, for example, between the series resonator S7 and the series resonator S6 or on the common terminal Port1 side of the series resonator S7.

Even with the quadplexer including the first filter (in the present modified example, the filter 12A) configured as described above, as is the case with the first preferred embodiment, it is possible to provide a filter having an excellent feature for both the ripples near an anti-resonant frequency and the insertion loss by providing the first electrode fingers and the second electrode fingers in the same or substantially the same sequence in the first portion and the second portion of the IDT electrode in at least one of the series resonators S6 and S7.

The series resonator in which the first electrode fingers and the second electrode fingers are arranged in the same or substantially the same sequence in the first portion and the second portion of the IDT electrode may be used as, of the series resonators S6 and S7, a series resonator that is not the series resonator having the lowest anti-resonant frequency (that is, the resonator that defines an end region of a pass band of the filter). This enables a filter having an excellent feature for both the ripples near an anti-resonant frequency and the insertion loss without losing steepness in the band pass characteristic of the filter.

Further, the filter 12A according to the present preferred embodiment enables adjustment of the filter characteristic to a preferable characteristic such as improved attenuation and the like by providing the longitudinally coupled filter structure.

Second Preferred Embodiment

The quadplexers according to the first preferred embodiment and the modified example described above are applicable to a radio frequency front-end circuit, and further to a communication device including this radio frequency front-end circuit. Therefore, in the present preferred embodiment, such a radio frequency front-end circuit and a communication device are described.

Figure 11:
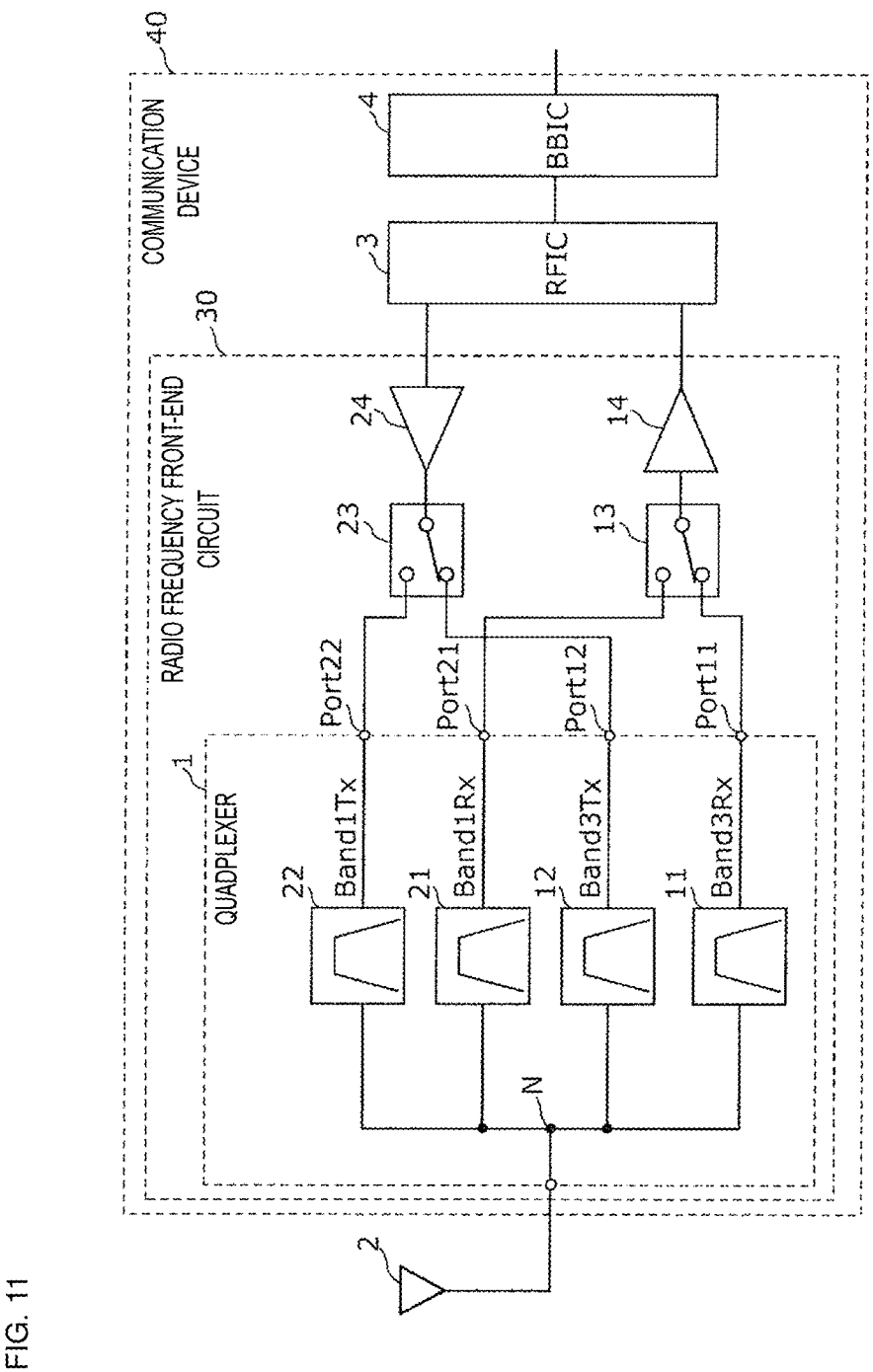
FIG. 11 is a configuration diagram of a radio frequency front-end circuit according to a second preferred embodiment of the present invention.

FIG. 11 is a configuration diagram of a radio frequency front-end circuit 30 according to a preferred embodiment 2. Note that FIG. 11 also illustrates elements (e.g., an antenna 2, a RF signal processing circuit (RFIC) 3, and a base band signal processing circuit (BBIC) 4) connected to the radio frequency front-end circuit 30. The radio frequency front-end circuit 30, the RF signal processing circuit 3, and the base band signal processing circuit 4 define a communication device 40.

The radio frequency front-end circuit 30 includes a quadplexer 1 according to the first preferred embodiment, a reception side switch 13 and a transmission side switch 23, a low noise amplifier circuit 14, and a power amplifier circuit 24.

The reception side switch 13 is a switch circuit including two selection terminals respectively connected to the individual terminals Port11 and Port21, which are reception terminals of the quadplexer 1, and a common terminal connected to the low noise amplifier circuit 14.

The transmission side switch 23 is a switch circuit including two selection terminals respectively connected to the individual terminals Port12 and Port22, which are transmission terminals of the quadplexer 1, and a common terminal connected to the power amplifier circuit 24.

Each of the reception side switch 13 and the transmission side switch 23 connects the common terminal to a signal path corresponding to a predetermined band in response to a control signal from a controller (not illustrated) and is, for example, a SPDT (single pole double throw) switch. Note that the selection terminal to be connected to the common terminal is not limited to one terminal, and a plurality of selection terminals may alternatively be connected to the common terminal. That is, the radio frequency front-end circuit 30 may be compatible with carrier aggregation.

The low noise amplifier circuit 14 is a reception amplifier circuit that amplifies a radio frequency signal (here, a received radio frequency signal) that goes through the antenna 2, the quadplexer 1, and the reception side switch 13 and outputs to the RF signal processing circuit 3.

The power amplifier circuit 24 is a transmission amplifier circuit that amplifies a radio frequency signal (here, a transmitting radio frequency signal) output from the RF signal processing circuit 3 and outputs to the antenna 2 via the transmission side switch 23 and the quadplexer 1.

The RF signal processing circuit 3 performs signal processing on the received radio frequency signal input from the antenna 2 via a reception signal path using down-converting and the like, for example, and outputs a reception signal generated by this signal processing to the base band signal processing circuit 4. Further, the RF signal processing circuit 3 performs signal processing on a transmission signal input from the base band signal processing circuit 4 using up-converting and the like, for example, and outputs a transmitting radio frequency signal generated by this signal processing to the power amplifier circuit 24. The RF signal processing circuit 3 is, for example, a RFIC.

The signal processed in the base band signal processing circuit 4 is used, for example, as an image signal for image display or as an audio signal for call.

Note that the radio frequency front-end circuit 30 may include other circuit elements between the elements described above.

According to the radio frequency front-end circuit 30 and the communication device 40 configured as described above, it becomes possible to provide an excellent characteristic for both the ripples in the isolation characteristic and the passage loss by including the quadplexer 1 according to the first preferred embodiment.

Note that instead of a quadplexer according to the first preferred embodiment, the radio frequency front-end circuit 30 may include the quadplexer 1 according to the modified example of the first preferred embodiment.

Further, depending on the processing system of a radio frequency signal, the communication device 40 may not need to include the base band signal processing circuit (BBIC) 4.

Other Preferred Embodiments

The filters, the multiplexers, the radio frequency front-end circuits, and the communication devices according to the preferred embodiments of the present invention have been described using the preferred embodiments and the modified example thereof. However, other preferred embodiments obtained by combining optional elements of the foregoing preferred embodiments and the modified example described above, modified examples obtained by applying various modifications apparent to those skilled in the art to the foregoing preferred embodiments without departing the scope of the present invention, and various devices including a radio frequency front-end circuit or a communication device according to preferred embodiments of the present invention may also be included in the present invention.

For example, in the foregoing description, the quadplexer is used as an example of the multiplexer. However, the present invention is also applicable to, for example, a triplexer in which antenna terminals of three filters are connected to a common terminal, or a hexaplexer in which antenna terminals of six filters are connected to a common terminal. That is, the multiplexer may only need to include two or more filters.

Further, the configuration of the multiplexer is not limited to the configuration that includes both the transmission filter and the reception filter and may alternatively have a configuration that includes only the transmission filter or only the reception filter.

Further, in the first preferred embodiment, it is described that the filter 12 corresponds to the first filter and the filter 11 is the second filter. That is, in the first preferred embodiment, the first filter and the second filter are the transmission filter and the reception filter, respectively. However, the present invention may be applied to any multiplexers without being limited by the usage and the like of the first filter and the second filter, as long as stop band ripples of the first filter are located in a pass band of the second filter. Accordingly, the first filter and the second filter may both be a transmission filter.

As described above, a filter according to a preferred embodiment of the present invention includes a pair of input/output terminals, and one or more series resonators on a signal path connecting the pair of input/output terminals, wherein each of the one or more series resonators includes an IDT electrode including a pair of comb-shaped electrodes on a substrate including a piezoelectric layer, each of the pair of comb-shaped electrodes included in each of the one or more series resonators includes a plurality of electrode fingers extending in a direction orthogonal or substantially orthogonal to an acoustic wave propagation direction, and a busbar electrode connecting one-side end portions of respective ones of the plurality of electrode fingers, the IDT electrode of each of the one or more series resonators is defined by first electrode fingers, second electrode fingers, or both the first electrode fingers and the second electrode fingers, the first electrode finger being one of the plurality of electrode fingers and having a wider electrode finger width at an another-side end portion thereof than an electrode finger width at a center portion thereof, the second electrode finger being one of the plurality of electrode fingers and having a narrower or equal electrode finger width at an another-side end portion thereof than an electrode finger width at a center portion thereof, the one or more series resonators includes one or more first series resonator, in the IDT electrode of each of the one or more first series resonators, a direction connecting the another-side end portions of respective ones of the plurality of electrode fingers crosses the acoustic wave propagation direction, and a first portion of the IDT electrode of each of the one or more first series resonators includes only the first electrode fingers, and a second portion and a third portion include only the second electrode fingers, the first portion being centrally located in the acoustic wave propagation direction, the second portion and the third portion being located on two sides of the first portion in the acoustic wave propagation direction.

According to this, the first electrode fingers (variant fingers) and the second electrode fingers (electrode fingers including no variant portion) are provided in a mixed manner in the IDT electrode of the first series resonator of the filter. Because of this, the ripples near an anti-resonant frequency that are likely to increase in the case where the first electrode finger is used for all of the electrode fingers and the ripples near a resonant frequency that are likely to increase in the case where the second electrode finger is used for all of the electrode fingers are both reduced or prevented.

As a result, it becomes possible to provide a filter that reduces or prevents both the ripples near a resonant frequency and the ripples near an anti-resonant frequency.

Further, the one or more series resonator may further include one or more second series resonators on the signal path connecting the pair of input/output terminals, and the IDT electrode that defines each of the one or more second series resonators may include the first electrode fingers.

Further, each of the one or more first series resonators may be used as a series resonator that is not the series resonator having a lowest anti-resonant frequency.

Because of this, the first electrode fingers and the second electrode fingers are mixed in a series resonator that is not the series resonator having the lowest anti-resonant frequency, that is, the series resonator that provides steepness in a pass band end region of the filter. As a result, it becomes possible to provide a filter having an excellent feature for both the ripples near an anti-resonant frequency and the insertion loss without losing steepness in the band pass characteristic of the filter.

Further, the filter may further include one or more parallel resonators on one or more paths that connect the signal path to ground and may have a ladder filter structure.

This enables adjustment of the filter characteristic to a preferable characteristic, such as less loss property and the like.

Further, a longitudinally coupled filter structure on the signal path may be included.

This enables adjustment of the filter characteristic to a preferable characteristic such as enhanced attenuation and the like.

Further, the substrate may include a piezoelectric layer in which the IDT electrode is provided on one of principal surfaces of the piezoelectric layer, a high acoustic velocity support substrate in which acoustic velocity of a bulk wave propagating through the high acoustic velocity support substrate is higher than acoustic velocity of an acoustic wave propagating through the piezoelectric layer, and a low acoustic velocity film in which acoustic velocity of a bulk wave propagating through the low acoustic velocity film is lower than acoustic velocity of a bulk wave propagating through the piezoelectric layer, the low acoustic velocity film being provided between the high acoustic velocity support substrate and the piezoelectric layer.

This enables the Q factor of each resonator including the IDT electrode provided on the substrate including the piezoelectric layer to be maintained at a high value.

Further, a multiplexer according to a preferred embodiment of the present invention includes a common terminal, a first terminal, and a second terminal, a first filter on a first path connecting the common terminal and the first terminal, and a second filter on a second path connecting the common terminal and the second terminal, a pass band of the second filter being higher in frequency than a pass band of the first filter, wherein the first filter is the filter described above.

This enables the multiplexer having an excellent feature in both the insertion loss in the second path and the isolation between the first terminal and the second terminal to be provided.

Further, a pass band of the first filter may be an uplink frequency band in Band 3 of LTE (Long Term Evolution), and a pass band of the second filter may be an uplink frequency band in Band 1 of LTE.

In the case where a pass band of the first filter is the uplink frequency band in Band 3 of LTE and a pass band of the second filter is an uplink frequency band in Band 1 of LTE, ripples in the pass band of the second filter are likely to increase. This enables reduction or prevention of an increase of the ripples effectively by configuring the series resonator closest to the common terminal of the first filter so as to satisfy the condition described above.

Further, a radio frequency front-end circuit according to a preferred embodiment of the present invention includes any one of the multiplexers described above, and an amplifier circuit connected to the multiplexer.

This enables the radio frequency front-end circuit that enables reduction or prevention of ripples in a pass band to be provided.

Further, a communication device according to a preferred embodiment of the present invention includes an RF signal processing circuit that performs processing on a radio frequency signal being transmitted or received by an antenna, and the foregoing radio frequency front-end circuit that transmits a radio frequency signal between the antenna and the RF signal processing circuit.

This enables to provide the communication device that enables reduction or prevention of ripples in a pass band.

Preferred embodiments of the present invention may be widely used in communication equipment such as cellular phones and the like, for example, as a filter, a multiplexer, a front-end circuit, and a communication device, which are applicable to multiband systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
a pair of input/output terminals; and
one or more series resonators on a signal path connecting the pair of input/output terminals; wherein
each of the one or more series resonators includes an IDT electrode including a pair of comb-shaped electrodes on a substrate including a piezoelectric layer;
each of the pair of comb-shaped electrodes included in each of the one or more series resonators includes:
a plurality of electrode fingers extending in a direction orthogonal or substantially orthogonal to an acoustic wave propagation direction; and
a busbar electrode connecting one-side end portions of respective ones of the plurality of electrode fingers;
the IDT electrode of each of the one or more series resonators includes first electrode fingers, second electrode fingers, or both the first electrode fingers and the second electrode fingers, the first electrode fingers having a wider electrode finger width at an another-side end portion thereof than an electrode finger width at a center portion thereof, the second electrode fingers having a narrower or equal electrode finger width at an another-side end portion thereof than an electrode finger width at a center portion thereof;
the one or more series resonators includes one or more first series resonators;
in the IDT electrode of each of the one or more first series resonators, a direction connecting the another-side end portions of respective ones of the plurality of electrode fingers crosses the acoustic wave propagation direction; and
a first portion of the IDT electrode of each of the one or more first series resonators includes only the first electrode fingers, and a second portion and a third portion include only the second electrode fingers, the first portion being centrally located in the acoustic wave propagation direction, the second portion and the third portion being located on two sides of the first portion in the acoustic wave propagation direction.

2. The filter according to claim 1, wherein
the one or more series resonators further include one or more second series resonators on the signal path connecting the pair of input/output terminals; and
the IDT electrode of each of the one or more second series resonators includes the first electrode fingers.

3. The filter according to claim 1, wherein each of the one or more first series resonators is a series resonator that does not have a lowest anti-resonant frequency.

4. The filter according to claim 1, further comprising:
one or more parallel resonators on one or more paths that connect the signal path to ground; wherein
the filter has a ladder filter structure.

5. The filter according to claim 1, further comprising a longitudinally coupled filter structure on the signal path.

6. The filter according to claim 1, wherein
the substrate includes:
a piezoelectric layer in which the IDT electrode is on one of principal surfaces of the piezoelectric layer;
a high acoustic velocity support substrate in which an acoustic velocity of a bulk wave propagating through the high acoustic velocity support substrate is higher than an acoustic velocity of an acoustic wave propagating through the piezoelectric layer; and
a low acoustic velocity film in which an acoustic velocity of a bulk wave propagating through the low acoustic velocity film is lower than the acoustic velocity of a bulk wave propagating through the piezoelectric layer, the low acoustic velocity film being between the high acoustic velocity support substrate and the piezoelectric layer.

7. A multiplexer comprising:
a common terminal, a first terminal, and a second terminal;
a first filter on a first path connecting the common terminal and the first terminal; and
a second filter on a second path connecting the common terminal and the second terminal, a pass band of the second filter being higher in frequency than a pass band of the first filter; wherein
the first filter is the filter according to claim 1.

8. The multiplexer according to claim 7, wherein
a pass band of the first filter is an uplink frequency band in Band 3 Long Term Evolution (LTE),
a pass band of the second filter is a downlink frequency band in Band 3 of LTE.

9. A radio frequency front-end circuit comprising:
the multiplexer according to claim 7; and
an amplifier circuit connected to the multiplexer.

10. A communication device comprising:
an RF signal processing circuit to perform processing on a radio frequency signal being transmitted or received by an antenna; and
the radio frequency front-end circuit according to claim 9, the radio frequency front-end circuit transmitting a radio frequency signal between the antenna and the RF signal processing circuit.

11. The filter according to claim 2, wherein each of the one or more first series resonators is a series resonator that does not have a lowest anti-resonant frequency.

12. The filter according to claim 2, further comprising:
one or more parallel resonators on one or more paths that connect the signal path to ground; wherein
the filter has a ladder filter structure.

13. The filter according to claim 3, further comprising:
one or more parallel resonators on one or more paths that connect the signal path to ground; wherein
the filter has a ladder filter structure.

14. The filter according to claim 2, further comprising a longitudinally coupled filter structure on the signal path.

15. The filter according to claim 3, further comprising a longitudinally coupled filter structure on the signal path.

16. The filter according to claim 4, further comprising a longitudinally coupled filter structure on the signal path.

17. The filter according to claim 2, wherein
the substrate includes:
  a piezoelectric layer in which the IDT electrode is on one of principal surfaces of the piezoelectric layer;
  a high acoustic velocity support substrate in which an acoustic velocity of a bulk wave propagating through the high acoustic velocity support substrate is higher than an acoustic velocity of an acoustic wave propagating through the piezoelectric layer; and
  a low acoustic velocity film in which an acoustic velocity of a bulk wave propagating through the low acoustic velocity film is lower than the acoustic velocity of a bulk wave propagating through the piezoelectric layer, the low acoustic velocity film being between the high acoustic velocity support substrate and the piezoelectric layer.

18. The filter according to claim 3, wherein
the substrate includes:
  a piezoelectric layer in which the IDT electrode is on one of principal surfaces of the piezoelectric layer;
  a high acoustic velocity support substrate in which an acoustic velocity of a bulk wave propagating through the high acoustic velocity support substrate is higher than an acoustic velocity of an acoustic wave propagating through the piezoelectric layer; and
  a low acoustic velocity film in which an acoustic velocity of a bulk wave propagating through the low acoustic velocity film is lower than the acoustic velocity of a bulk wave propagating through the piezoelectric layer, the low acoustic velocity film being between the high acoustic velocity support substrate and the piezoelectric layer.

19. The filter according to claim 4, wherein
the substrate includes:
  a piezoelectric layer in which the IDT electrode is on one of principal surfaces of the piezoelectric layer;
  a high acoustic velocity support substrate in which an acoustic velocity of a bulk wave propagating through the high acoustic velocity support substrate is higher than an acoustic velocity of an acoustic wave propagating through the piezoelectric layer; and
  a low acoustic velocity film in which an acoustic velocity of a bulk wave propagating through the low acoustic velocity film is lower than the acoustic velocity of a bulk wave propagating through the piezoelectric layer, the low acoustic velocity film being between the high acoustic velocity support substrate and the piezoelectric layer.

20. The filter according to claim 5, wherein
the substrate includes:
  a piezoelectric layer in which the IDT electrode is on one of principal surfaces of the piezoelectric layer;
  a high acoustic velocity support substrate in which an acoustic velocity of a bulk wave propagating through the high acoustic velocity support substrate is higher than an acoustic velocity of an acoustic wave propagating through the piezoelectric layer; and
  a low acoustic velocity film in which an acoustic velocity of a bulk wave propagating through the low acoustic velocity film is lower than the acoustic velocity of a bulk wave propagating through the piezoelectric layer, the low acoustic velocity film being between the high acoustic velocity support substrate and the piezoelectric layer.

* * * * *